United States Patent [19]

Mahant-Shetti et al.

[11] Patent Number: 5,068,825
[45] Date of Patent: Nov. 26, 1991

[54] MEMORY CELL CIRCUIT AND OPERATION THEREOF

[75] Inventors: Shivaling S. Mahant-Shetti, Richardson; Mark G. Harward, Dallas, both of Tex.

[73] Assignee: Texas Instruments Incorporated, Dallas, Tex.

[21] Appl. No.: 546,497

[22] Filed: Jun. 29, 1990

[51] Int. Cl.⁵ .......................................... G11C 13/00
[52] U.S. Cl. .................................. 365/154; 365/203; 365/233
[58] Field of Search .................. 365/154, 189.01, 203, 365/189.07, 190, 205, 233

[56] References Cited

U.S. PATENT DOCUMENTS 4,184,208 1/1980 Tubbs ................................. 365/203
4,995,001 2/1991 Dawson et al. ..................... 365/154

Primary Examiner—Terrell W. Fears
Attorney, Agent, or Firm—Douglas A. Sorensen; James T. Comfort; Melvin Sharp

[57] ABSTRACT

An improved memory cell 118 is provided utilizing transistor pairs 142, 144 ands 160, 162 as dual purpose transistor pairs for the two modes of operation of the cell. During the first or non-access mode of operation, the transistor pairs operate as switched capacitive elements in order to provide an equivalent resistance between bit line 140 and first node 26 and inverted bit line 158 and second node 130. Control circuit 119 maintains bit lines 140 and inverted bit line 158 high during this non-access mode. During the second or access mode of operation, each transistor pair operates as a respective pass transistor for connecting bit line 140 to first node 126 and inverted bit line 158 to second node 130 so that data may be read from, or written to, the cross-coupled transistors 120 and 122.

27 Claims, 2 Drawing Sheets

MEMORY CELL CIRCUIT AND OPERATION THEREOF

TECHNICAL FIELD OF THE INVENTION

This invention relates to integrated circuits, and more particularly to a memory cell circuit and the operation thereof.

BACKGROUND OF THE INVENTION

In contemporary memory technology, static random access memory (SRAM) cells may be constructed in various circuit configurations. These circuits are constructed in order to provide data retention capabilities while minimizing power requirements, current leakage and overall device size. Furthermore, the manufacturability of the circuit must be maximized. Consequently, it is desirable to construct a memory cell with a minimum number of components and designed to diminish the impact on integrated circuit fabrication difficulty. For each component within the cell, there is therefore also consideration of the component size and both internal and external interconnections to the component.

A typical contemporary SRAM cell is constructed in a 4T-2R configuration. The two resistances within this configuration may either comprise resistor elements or switched capacitors utilized in order to create an equivalent resistance. Although the 4T-2R cell is compact, the pass transistors constructed as a part of the cell are of critical size because the remaining transistors of the cell must be constructed in a size directly proportional to the size of the pass transistors. As a result, the selection of a predetermined size for the pass transistor necessarily defines a larger size for the remaining transistors within the cell. Thus, larger transistors and accommodating resistors must be included within the cell, thereby undesirably increasing device size and power requirements. Further, the large resistors require a large amount of resistance in a relatively small area thereby producing additional problems known in the art.

An alternative 4T-2R cell may be constructed utilizing switched capacitive resistances. This device requires a total of eight transistors in order to complete the cell configuration. Thus, the use of switched capacitive resistances requires a total of eight transistors with numerous interconnections to the gates, sources, and drains of these transistors. Each external interconnection requires contact to the device and consequently consumes more surface area on the device, and may also require difficult and aggressive interconnect fabrication processes. As a result, device sizes are increased along with device capacitance and other problems associated with excessive external interconnections.

Therefore, a need has arisen for a memory cell which includes a minimum number of devices and associated interconnections, consumes minimal power, and may be constructed within a small area.

SUMMARY OF THE INVENTION

In accordance with the present invention, a memory cell circuit and the operation thereof are provided which substantially eliminate and prevent disadvantages and problems associated with prior memory cell devices.

A memory cell constructed in accordance with the present invention comprises a storage device for storing a data value, a first transistor series pair coupled to a first node of the storage device and a second transistor series pair coupled to a second node of the storage device. Both the first and second transistor series pairs are operable in a first mode to pull up a voltage at the first and second nodes, respectively. Additionally, the first and second transistor series pairs are operable in a second mode to provide electrical access to the first and second nodes, respectively, for read/writing the storage device.

An additional aspect of the memory cell of the present invention includes a clocking circuit for clocking the transistors of the first transistor series pair in a non-overlapping fashion during the first mode. Further, the clocking circuit may be operable to clock the transistors of the second transistor series pair in a non-overlapping fashion during the first mode. The present invention further provides for a supply circuit for providing a predetermined voltage to both the first and second transistor series pairs during the first mode. A control circuit may also be provided within the present invention for causing each of the transistor series pairs to conduct during the second mode.

The present invention provides numerous technical advantages over prior memory cell configurations. A memory cell constructed in accordance with the present invention includes a minimal number of devices used to effect efficient data storage and retrieval. The switched capacitance configuration of the present invention provides the technical advantages of a controllable resistance in order to compensate for leakage current and ease in device fabrication due to the elimination of the need for resistors. Further, there is the technical advantage of reduced power consumption and variable resistance to compensate for current leakage arising from changes in temperature. Additionally, the use of series transistor pairs for performing independent functions during a first and second mode provide the technical advantage of reduction in the number of necessary transistors along with a corresponding reduction in device size. As a result, there are the technical advantages of reduced device capacitance and the capability of maximum packing density for an array of memory cells constructed in accordance with the present invention.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
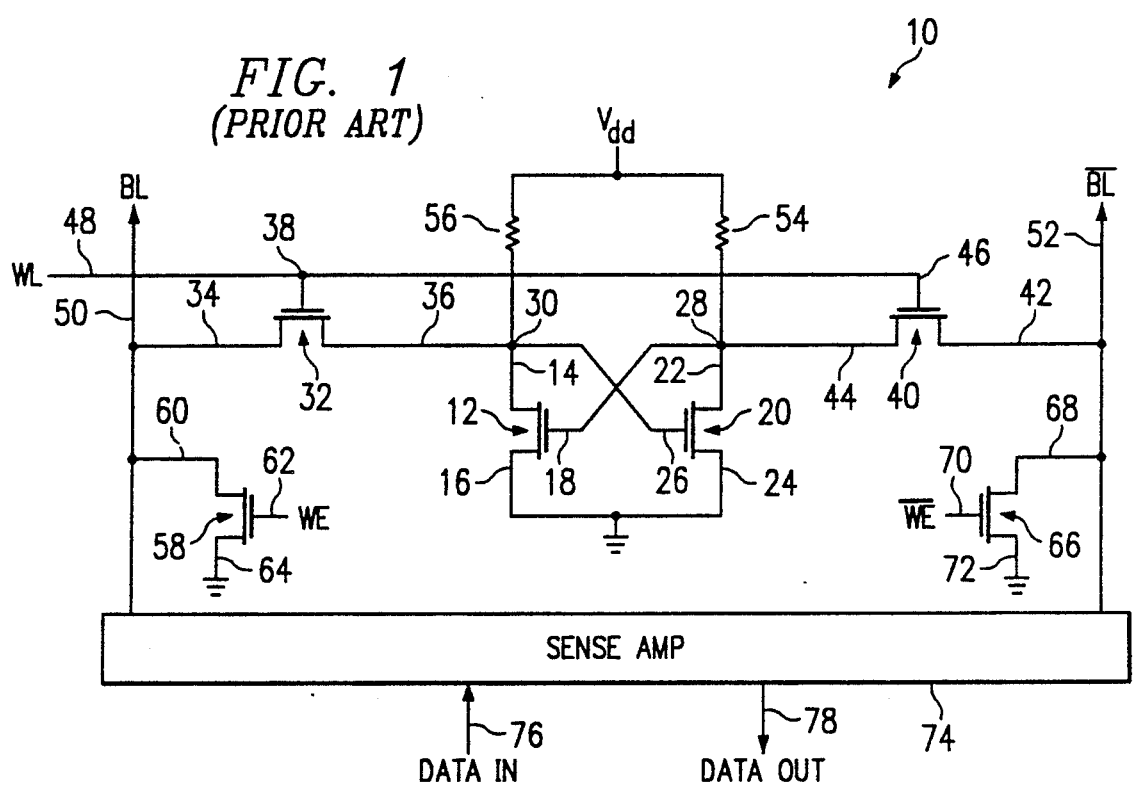
FIG. 1 illustrates a prior art 4T-2R SRAM memory cell.

FIG. 1 illustrates a prior art memory cell designated generally at 10. Memory cell 10 includes a storage device comprising a first transistor 12 having a drain 14, a source 16 and a gate 18 and a second transistor 20 having a drain 22, a source 24 and a gate 26. First and second transistors 12 and 20 are connected in a crossed-coupled configuration. Accordingly, gate 18 of first transistor 12 is connected to drain 22 of second transistor 20. This gate-to-drain connection of first transistor 12 to second transistor 20 defines a first node 28. Similarly, gate 26 of second transistor 20 is connected to drain 14 of first transistor 12. This gate-to-drain connection of second transistor 20 to first transistor 12 defines a second node 30. The sources 16 and 24 of first and second transistors 12 and 20 are connected together and are further connected to ground.

Memory cell 10 further includes a first pass transistor 32 having a drain 34, a source 36 and a gate 38. Similarly, memory cell 10 includes a second pass transistor 40 including a drain 42, a source 44 and a gate 46. Sources 36 and 44 of pass transistors 38 and 46 are connected to second and first nodes 30 and 38 respectively. Gates 38 and 46 of pass transistors 32 and 40 are connected together and are further connected to a word line 48. Drain 34 of first pass transistor 32 is connected to a bit line 50. Drain 42 of second pass transistor 40 is connected to an inverted bit line 52. First and second nodes 28 and 30 are connected to a supply voltage, $V_{dd}$, through resistors 54 and 56 respectively.

A write enable transistor 58 includes a source 60, a gate 62 and a drain 64. Source 60 of write enable transistor 58 is connected to bit line 50. Gate 62 of write enable transistor 58 is operable to receive a write enable signal denoted WE. Similarly, a second write enable transistor 66 includes a source 68, a gate 70 and a drain 72. Source 68 is connected to inverted bit line 52. Gate 70 of second write enable transistor 66 is operable to receive the inverse of write enable signal. Drains 64 and 72 of write enable transistors 58 and 66 are connected to ground. Both bit line 50 and inverted bit line 52 are also connected to sense amp 74. Sense amp 74 has an input 76 for receiving data and an output 78 for outputting data. While write enable transistors 58 and 66 are shown as part of cell 10, it should be understood as known in the art that a plurality of cells may be connected in an array wherein each column of the array has a single pair of write enable transistors connected thereto.

The operation of memory cell 10 in general is as follows. Memory cell 10 operates in two different modes. The first mode is a non-access or storage mode in which memory cell 10 retains a data value representative of either a binary zero or one. The second mode of operation for memory cell 10 is an access mode in which binary information is either read from or written to memory cell 10.

In the non-access or storage mode, the word line signal and corresponding word line 48 are low. Accordingly, first and second pass transistors 32 and 40 are in a non-conducting state and therefore, cross-coupled transistors 12 and 20 are effectively isolated from bit line 50 and inverted bit line 52. In this mode, depending on the binary value stored by memory cell 10, either first transistor 12 or second transistor 20 is on while the opposing transistor is off. For example, consider the instance where first transistor 12 is on while second transistor 20 is off. With first transistor 12 on, second node 30 will be effectively coupled through transistor 12 to ground. Accordingly, gate 26 of second transistor 20, which is connected to second node 30, is low thereby maintaining second transistor 20 in a non-conducting state. With second transistor 20 in a non-conducting state, gate 18 of first transistor 12 is coupled through resistor 54 to the supply voltage, $V_{dd}$.

The resistance value of resistor 54 is selected so that in the example described above a sufficient voltage is retained at second node 28 and gate 18 of first transistor 12 in order to maintain first transistor 12 in a conducting state. However, as is known in the art, current will slowly leak from first node 28 and therefore the resistance value of resistor 54 must be chosen at a suitable resistance in order to allow sufficient current to be drawn from the power supply voltage in order to compensate for the current which leaks from first node 28. Additionally, in order to accommodate the increase of resistance with the increase of temperature, the resistance value of resistor 54 must be selected such that sufficient current is provided to first node 28 during this exemplary mode notwithstanding fluctuations in temperature. It should be noted that due to the symmetric construction of memory cell 10 that the selection of resistance 56 is the same as that for resistor 54 so that the cell may operate in an opposite fashion, that is, where second transistor 20 is conducting while first transistor 12 is not.

An additional problem, known in the art, pertaining to prior art memory cell 10 is the effects of increasing temperature. In particular, leakage current associated with nodes 28 and 30 of memory cell 10 increases with increases in temperature. Thus, during high temperature operation, it is desirable to provide a greater amount of current to nodes 28 and 30 in order to compensate for the increased leakage current. However, resistors 54 and 56 are typically fabricated with materials which increase in resistance as temperature increases, and therefore cause a decrease, rather than an increase, in the supply of current to nodes 28 and 30 as temperature increases. In an effort to solve this problem, a prior art solution has been to reduce the nominal temperature resistance value of resistors 54 and 56 to ensure adequate current to nodes 28 and 30, respectively, during first mode operation at elevated temperatures. This reduction in nominal resistance gives rise to an overall increase in power consumption in an effort to widen the temperature operating range of memory cell 10.

During the second or access mode for memory cell 10, the word line signal on word line 48 is high causing pass transistors 32 and 40 to conduct. As a result, first and second nodes 28 and 30 are coupled through pass transistors 40 and 32 to inverted bit line 52 and bit line 50, respectively. Once this connection is established, memory cell 10 may either be written to with data, or in the alternative, data may be read therefrom.

In order to write to memory cell 10 during the second mode wherein pass transistors 32 and 40 are conducting, data is transferred to sense amp 74 via input 76. Sense amp 74 provides complementary signals to gates 62 and 70 of write enable transistors 58 and 66, respectively, as known in the art. Accordingly, the write enable signal is applied in order to selectively ground either bit line 50 or inverted bit line 52. As a result, cross-coupled transistors 12 and 20 may be maintained at their current state or may be switched to an alternative state. In order to read data from memory cell 10, sense amp 74 senses the relative amplitudes of the signals on bit line 50 and inverted bit line 52 and provides a data output via output 78 as known in the art.

Memory cell 10 therefore provides a 4T-2R configuration for storage/retrieval of data. Although only four transistors are necessary, overall device size is increased due to the resistors included within the cell. Further, complexity and costs of fabrication are increased due to the inclusion of resistors.

Figure 2:
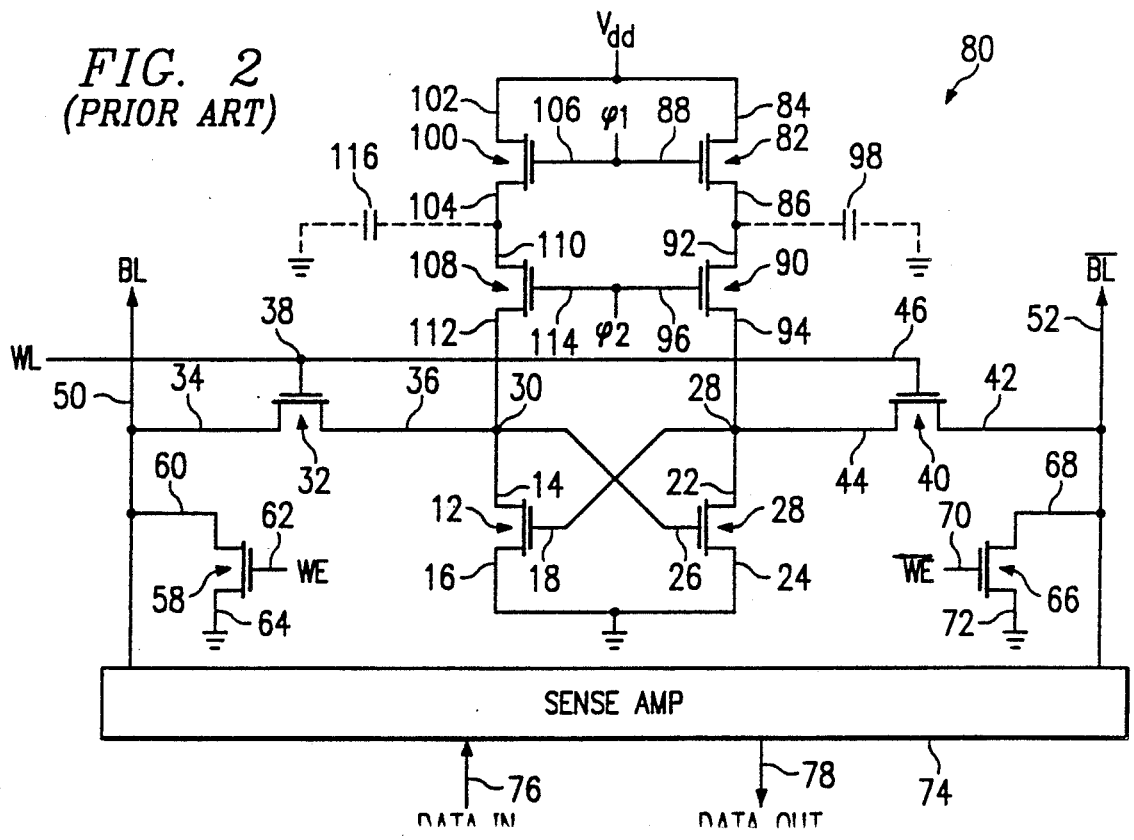
FIG. 2 illustrates a prior art 6T SRAM memory cell.

FIG. 2 illustrates a prior art eight transistor memory cell designated generally at 80. Memory cell 80 of FIG. 2 is similar to memory cell 10 of FIG. 1 and therefore like parts of both memory cells have been given like designation numerals. However, resistors 54 and 56 of memory cell 10 are each replaced within memory cell 80 by a respective switched capacitive system. The switched capacitive system replacing resistor 54 comprises a first transistor 82 having a drain 84, a source 86 and a gate 88, and a second transistor 90 having a drain 92, a source 94 and a gate 96. Source 86 of first transistor 82 is connected to drain 92 of second transistor 90. This connection is further connected to a parasitic capacitor 98 (shown in phantom) which is further connected to the device substrate. Typically the substrate is connected as shown, that is, to ground. It should be noted that parasitic capacitor 98 may be connected to a common node other than the substrate. Further, capacitor 98 may represent additional parasitic node capacitance other than junction capacitance.

In a similar fashion to the above description, resistor 56 of memory cell 10 shown within FIG. 1 is replaced in FIG. 2 by a two transistor switched capacitive configuration. This configuration includes a third transistor 100 having a drain 102, a source 104 and a gate 106. Additionally, the switched capacitive configuration includes a fourth transistor 108 including a drain 110, a source 112 and a gate 114. Source 104 of third transistor 100 is connected to drain 110 of fourth transistor 108. This connection is further connected to a parasitic capacitor 116 (shown in phantom) which like parasitic capacitor 98 is further connected to the device substrate which is typically connected to ground, or may be connected to a common node as discussed with reference to parasitic capacitor 98. Drains 84 and 102 of transistors 82 and 100, respectively, are connected to the power supply voltage $V_{dd}$. Gates 88 and 106 of transistors 82 and 100 are connected to one another and are operable to receive a first clocking signal, $\phi 1$. Similarly, gates 96 and 114 of transistors 90 and 108 are connected and are operable to receive a second clocking signal, $\phi 2$.

Memory cell 80 operates in the same two modes discussed in connection with memory cell 10 of FIG. 1. The second mode or access mode occurs in an identical fashion as that described in connection with memory cell 10 of FIG. 1. However, in the first mode, the transistor pairs comprising first and second transistors 82 and 90 and third and fourth transistors 100 and 108 provide an equivalent resistance to the resistance provided by resistors 54 and 56 shown in FIG. 1. In particular, and as known in the art, the combination of first and second transistors 82 and 90 along with the capacitance provided by parasitic capacitor 98 may be clocked in such a way that resistance may be approximated by:

$$R = \frac{1}{fC} \qquad \text{EQN. 1}$$

where,
R is the equivalent resistance of a switched transistor pair;
f is the frequency of the clocking signals, $\phi 1$ and $\phi 2$; and
C is the capacitance of parasitic capacitor 98.

Similarly, third and fourth transistors 100 and 108 operate also to provide an equivalent resistance in accordance with equation 1 above. In particular, clock signals $\phi 1$ and $\phi 2$ are non-overlapping clock signals which cause transistors 82 and 100 to conduct at one point in time and transistors 90 and 108 to conduct at a separate point in time. This alternative switching causes charge during the first point in time to be transferred from the power supply voltage $V_{dd}$ through transistors 82 and 100 to parasitic capacitors 98 and 116, respectively. Thereafter, $\phi 1$ is low while $\phi 2$ is high, causing transistors 90 and 108 to conduct. During this conduction state, charge may pass from parasitic capacitors 98 and 116 to node 28 and node 30 respectively. Accordingly, an equivalent resistance is accomplished through the use of alternately switched transistor pairs. It should be noted that the equivalent resistance is provided to accomplish the same purpose as resistors 54 and 56 discussed in connection with FIG. 1.

Memory cell 80 of FIG. 2 therefore provides a memory device wherein the need for large resistors as discussed in connection with FIG. 1 is eliminated. However, a trade-off occurs because a total of six device transistors (excluding write enable transistors 58 and 66) are necessary as opposed to the four transistors associated with memory cell 10 of FIG. 1. Additionally, memory cell 80 of FIG. 2 requires interconnections between the added transistors and includes separate connections for the bit lines and word lines to the pass transistors of the memory cell. The present invention minimizes the number of transistors utilized within the cell while further minimizing the number of interconnections associated therewith.

Figure 3:
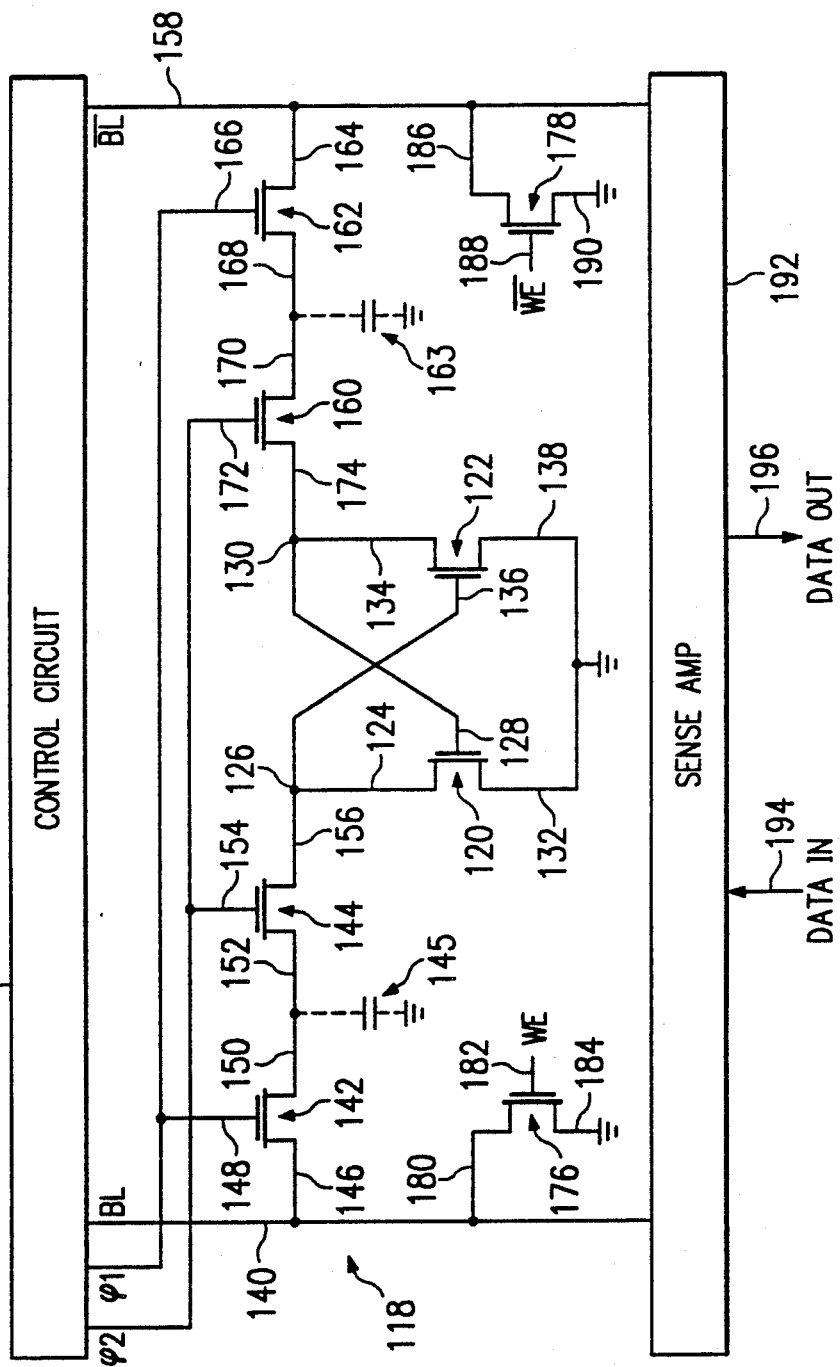
FIG. 3 illustrates a schematic of a memory cell constructed and operated in accordance with the present invention.

FIG. 3 illustrates a memory cell 118 and control circuit 119 and sense amp 192 constructed and operated in accordance with the present invention. Memory cell 118 includes a pair of cross-coupled transistors, including a first transistor 120 and a second transistor 122. In the preferred embodiment, first and second transistors 120 and 122 are n channel transistors. First transistor 120 includes a source 124 connected to a first node 126. The gate 128 of first transistor 120 is connected to a second node 130. The drain 132 of first transistor 120 is connected to ground. Second transistor 122 is cross-coupled to first transistor 120. Accordingly, the source 134 of second transistor 122 is connected to second node 130 which is connected to gate 128 of first transistor 120. The gate 136 of second transistor 122 is connected to first node 126. The drain 138 of second transistor 122 is connected to ground.

First node 126 is coupled to a bit line 140 through a series connected pair of transistors 142 and 144. In the preferred embodiment, transistors 142 and 144 are n channel transistors. A parasitic capacitance 145 (shown in phantom) exists between transistors 142 and 144 and the device substrate. Parasitic capacitance 145 may be connected to a common node other than the substrate. Further, parasitic capacitance 145 may represent additional parasitic node capacitance other than junction capacitance. Typically, this capacitance is connected as shown, that is, to ground. The source 146 of transistor 142 is connected to bit line 140. The gate 148 of transistor 142 is connected for receiving a clocking signal $\phi 1$. The drain 150 of transistor 142 is connected to the source 152 of transistor 144. The gate 154 of transistor 144 is connected to a clocking signal $\phi 2$. The drain 156 of transistor 144 is connected to first node 126.

Second node 130 is coupled to inverted bit line 158 by a pair of series transistors 160 and 162. In the preferred embodiment, transistors 160 and 162 are n channel transistors. A parasitic capacitance 163 (shown in phantom)

exists between transistors 160 and 162 and the device substrate. Parasitic capacitance 163, like capacitance 145, may be connected to a common node other than the device substrate and may comprise node capacitances other than junction capacitance. The source 164 of transistor 162 is connected to inverted bit line 158. The gate 166 of transistor 162 is connected to the clocking signal $\phi1$. The drain 168 of transistor 162 is connected to the source 170 of transistor 160. The gate 172 of transistor 160 is connected to the clocking signal $\phi2$. The drain 174 of transistor 160 is connected to second node 130.

Bit line 140 and inverted bit line 158 each have a respective write enable transistor 176 and 178 associated therewith. In particular, the source 180 of write enable transistor 176 is connected to bit line 140. The gate 182 of write enable transistor 176 is connected to receive a write enable signal (WE). The drain 184 of write enable transistor 176 is connected to ground. Similarly, write enable transistor 178 includes a source 186 connected to inverted bit line 158. The gate 188 is connected to receive the inverted write enable signal $\overline{WE}$. The drain 190 of write enable transistor 178 is connected to ground.

Both bit line 140 and inverted bit line 158 are connected to a sense amp 192 in the same manner as discussed in connection with FIGS. 1 and 2 above. Accordingly, sense amp 192 includes an input 194 for receiving data and an output 196 for outputting data.

The operation of memory cell 118 is as follows. Memory cell 118 operates, in general, in the same two different modes as those discussed in connection with FIGS. 1 and 2. Thus, the first mode is a non-access or storage mode in which memory cell 118 retains a data value. The second mode of operation of memory cell 118 is an access mode in which binary information is either read from or written to memory cell 118.

In the non-access or storage mode, the transistor pairs of transistor 142 and 144 and transistors 160 and 162 each operate as a respective switched capacitive configuration. In particular, during this mode, clocking signals $\phi1$ and $\phi2$ are caused to alternate by control circuit 119 such that clocking signal $\phi1$ is high while clocking signal $\phi2$ is low and vice versa. Thus, when clocking signal $\phi1$ is high, transistors 142 and 162 are on, while transistors 144 and 160 are off. Thereafter, the clocking signals alternate such that $\phi2$ goes high turning on transistors 144 and 160, while $\phi1$ goes low turning off transistors 142 and 162. In this manner, each of the respective transistor pairs connected between bit line 140 and first node 126 and inverted bit line 158 and second node 130 provide an equivalent resistance which may be approximated by:

$$R = \frac{1}{fC} \qquad \text{EQN. 2}$$

where,

R is the equivalent resistance of the switched transistor pair;

f is the frequency of the clocking signals $\phi1$ and $\phi2$; and

C is the capacitance of either parasitic capacitor 145 or 163.

Thus, from the above, it may be appreciated that during the non-access mode of operation, the respective transistor pairs including transistors 142 and 144 and transistors 160 and 162 provide an equivalent resistance between bit line 140 and first node 126 and inverted bit line 158 and second node 130. Further, during the non-access mode, control circuit 119 connects both bit line 140 and inverted bit line 158 to the supply voltage, $V_{dd}$. Accordingly, charge may be transferred from lines 140 and 158 via the switched transistor pairs to first and second nodes 126 and 130, respectively.

The switched transistor pairs of memory cell 118 of the present invention may further be operated to overcome the temperature/leakage current problems discussed in connection with FIG. 1. As discussed above, prior art memory cells incurs an increase in current leakage with increases in temperature. The resistance values are adjusted in an effort to compensate this leakage, but this causes a tradeoff in that overall power consumption is increased. Memory cell 118 of the present invention may utilize a temperature-controlled clock frequency during the first mode. In particular, a temperature dependent clock frequency control circuit for clocking signals $\phi1$ and $\phi2$ may be provided to compensate for increasing temperature and the corresponding increase in leakage current. More specifically, the control circuit causes clocking signals $\phi1$ and $\phi2$ to increase in frequency as temperature increases. As may be appreciated from Equation 2, an increased frequency reduces the equivalent resistance between lines 140 and 158 and nodes 126 and 130, respectively. As a result, current supply to nodes 126 and 130 is increased with an increase in temperature in order to compensate for the additional current leakage. Thus, the present invention provides the additional advantage of a wide temperature operating range without sacrificing low power consumption at low temperatures.

In the second or access mode of operation, each transistor pair, including transistors 142 and 144 and transistors 160 and 162, operate as pass transistors in a manner similar to that discussed in connection with FIG. 2. In particular, during the access mode, clocking signals $\phi1$ and $\phi2$ are both held at a high potential by control circuit 119. Accordingly, each of transistors 142, 144, 160 and 162 conduct. Thus, first node 126 is connected to bit line 140 and second node 130 is connected to inverted bit line 158. Control circuit 119 no longer maintains bit line 140 and inverted bit line 158 at $V_{dd}$. Instead, during the access mode, lines 140 and 158 are controlled by sense amp 192 as known in the art for read/writing memory cell 118. Thus, during the access mode, data may be written to, or read from, the cell utilizing bit line 140, inverted bit line 158, and sense amp 192.

From the above description, it may be appreciated that the present invention provides a memory cell having dual purpose transistor pairs, including transistors 142 and 144 and transistors 160 and 162. Each transistor pair performs a different function during the two general modes of operation for the memory cell. In particular, during the non-access mode of operation, each transistor pair provides an equivalent resistance between a respective bit line and node of the memory cell. During the second or access mode of operation, each transistor pair operates as an equivalent pass transistor in order to provide access in order to either read from, or write to, the memory cell. This duality of function for the transistor pairs provides improved benefits associated with the cell for each of the two functions performed by the transistor pairs. For example, during the first mode where the first transistors operate as equivalent resistances, the use of switched transistor pairs permits reduced device size and implementation of resistance without the need for fabricating a resistor within a small area. By utilizing the same transistor pairs as pass transistors during the second or access mode of operation, an overall reduction in the number of transistors for the cell is achieved. Further, no independent external connection of each cell to the power supply voltage is necessary and therefore, the number of external interconnections is significantly reduced. This reduction in external connection increases device efficiency, reduces device size and leakage and improves both ease and cost of device fabrication.

Although the present invention has been described in detail, it should be understood that various substitutions, alterations and changes may be made hereto without departing from the spirit and scope of the invention as defined by the appended claims.

What is claimed is:

1. A memory cell, comprising:
    a storage device for storing a data value;
    a first transistor series pair coupled to a first node of said storage device, and operable in a first mode to pull up a voltage at said first node and in a second mode to provide electrical access to said first node for read/writing said storage device; and
    a second transistor series pair coupled to a second node of said storage device, and operable in the first mode to pull up a voltage at said second node to a predetermined voltage level and in the second mode to provide electrical access to said second node for read/writing said storage device.

2. The memory cell of claim 1 wherein said storage device comprises a cross-coupled transistor pair, wherein said first node comprises a gate of the first transistor of said cross-coupled transistor pair and wherein said second node comprises a gate of the second transistor of said cross-coupled transistor pair.

3. The memory cell of claim 1 wherein said first transistor series pair comprises:
    a first transistor having a source, drain and gate, said source operable to connect to a first access line and said gate operable to receive a first control signal; and
    a second transistor having a source, drain and gate, said source coupled to said drain of said first transistor, said gate operable to receive a second control signal and said drain coupled to said first node.

4. The memory cell of claim 3 wherein said second transistor series pair comprises:
    a third transistor having a source, drain and gate, said source operable to connect to a second access line and said gate operable to receive the first control signal; and
    a fourth transistor having a source, drain and gate, said source coupled to said drain of said third transistor, said gate operable to receive the second control signal and said drain coupled to said second node.

5. The memory cell of claim 4 wherein each of said first, second, third and fourth transistors comprise n channel transistors.

6. The memory cell of claim 1 and further comprising a clocking circuit for clocking the transistors of said first transistor series pair in a non-overlapping fashion during said first mode.

7. The memory cell of claim 6 wherein said clocking circuit is further operable to clock the transistors of said second transistor series pair in a non-overlapping fashion during said first mode.

8. The memory cell of claim 1 and further comprising a supply circuit for providing the predetermined voltage level to both of said first and second transistor series pairs during said first mode.

9. The memory cell of claim 1 and further comprising a conduct circuit for causing each of said transistor series pairs to conduct during said second mode.

10. The memory cell of claim 1 and further comprising a temperature dependent clocking circuit for clocking the transistors of said first transistor series pair and said second transistor pair at a frequency which increases with increases in temperature.

11. A memory cell, comprising:
    a cross-coupled transistor pair for storing a data value;
    a first transistor series pair coupled to a first node of said storage device, and operable in a first mode pull up a voltage at said first node by transferring a predetermined voltage level to said first node and in a second mode to provide electrical access to said first node for read/writing said storage device;
    a second transistor series pair coupled to a second node of said storage device, and operable in the first mode to pull up a voltage at said second node by transferring a predetermined voltage to said second node and in the second mode to provide electrical access to said second node for read/writing said storage device; and
    a clocking circuit for alternatively clocking the transistors of said first and second transistor pairs in a non-overlapping fashion during said first mode;
    a supply circuit for providing the predetermined voltage to both of said first and second transistor pairs during said first mode; and
    a conduct circuit for causing each of said transistor pairs to conduct during said second mode.

12. The memory cell of claim 11 wherein said first node comprises a gate of the first transistor of said cross-coupled transistor pair and wherein said second node comprises a gate of the second transistor of said cross-coupled transistor pair.

13. The memory cell of claim 11 wherein said first transistor series pair comprises:
    a first transistor having a source, drain and gate, said source operable to connect to a first access line and said gate operable to receive a first control signal; and
    a second transistor having a source, drain and gate, said source coupled to said drain of said first transistor, said gate operable to receive a second control signal and said drain coupled to said first node, and wherein said second transistor series pair comprises:
    a third transistor having a source, drain and gate, said source operable to connect to a second access line and said gate operable to receive the first control signal; and
    a fourth transistor having a source, drain and gate, said source coupled to said drain of said third transistor, said gate operable to receive the second control signal and said drain coupled to said second node.

14. The memory cell of claim 13 wherein each of said first, second, third and fourth transistors comprise n channel transistors.

15. The memory cell of claim 11 wherein said clocking circuit comprises a temperature dependent clocking circuit for clocking the transistors of said first transistor series pair and said second transistor pair at a frequency which increases with increases in temperature.

16. A method of operating a memory cell comprising a storage device, comprising:
   operating a first transistor series pair coupled to a first node of the storage device in a first mode to pull up a voltage at the first node;
   operating the first transistor series pair in a second mode to provide electrical access to the first node for read/writing the storage device;
   operating a second transistor series pair coupled to a second node of the storage device in the first mode to pull up a voltage at the second node; and
   operating the second transistor series pair in the second mode to provide electrical access to the second node for read/writing the storage device.

17. The method of claim 16 wherein said step of operating the first transistor series pair in the first mode comprises alternatively clocking the gates of the transistors in the first series pair.

18. The method of claim 16 wherein said step of operating the second transistor series pair in the first mode comprises alternatively clocking the gates of the transistors in the second series pair.

19. The method of claim 16 wherein said step of operating the first transistor series pair in the second mode comprises causing the transistors in the first series pair to conduct during the second mode.

20. The method of claim 16 wherein said step of operating the second transistor series pair in the second mode comprises causing the transistors in the second series pair to conduct during the second mode.

21. The method of claim 16 and further comprising supplying a predetermined voltage level to the first transistor series pair during the first mode such that the first node may be pulled up by said predetermined voltage level.

22. The method of claim 16 and further comprising supplying a predetermined voltage level to the second transistor series pair during the first mode such that the second node may be pulled up by said predetermined voltage level.

23. The method of claim 16 and further comprising clocking the first and second transistor series pairs at a frequency which increases with increases in temperature.

24. A method of operating a memory cell comprising a storage device, comprising:
   operating a first transistor series pair coupled to a first node of the storage device in a first mode to pull up a voltage at the first node, wherein said operating step comprises alternatively clocking the gates of the transistors in the first series pair;
   operating the first transistor series pair in a second mode to provide electrical access to the first node for read/writing the storage device;
   operating a second transistor series pair coupled to a second node of the storage device in the first mode to pull up a voltage at the second node, wherein said operating step comprises alternatively clocking the gates of the transistors in the second series pair; and
   operating the second transistor series pair in the second mode to provide electrical access to the second node for read/writing the storage device.

25. The method of claim 24 wherein said step of operating the first transistor series pair in the second mode comprises causing the transistors in the first series pair to conduct during the second mode, and wherein said step of operating the second transistor series pair in the second mode comprises causing the transistors in the second series pair to conduct during the second mode.

26. The method of claim 25 and further comprising:
   supplying a predetermined voltage level to the first transistor series pair during the first mode such that the first node may be pulled up by said predetermined voltage level; and
   supplying a predetermined voltage level to the second transistor series pair during the first mode such that the second node may be pulled up by said predetermined voltage level.

27. The method of claim 24 wherein said step of operating the first transistor series pair in the first mode and wherein said step of operating the second transistor series pair in the first mode comprises clocking the first and second transistor series pairs at a frequency which increases with increases in temperature.

* * * * *